(12) United States Patent
Han et al.

(10) Patent No.: US 8,642,997 B2
(45) Date of Patent: Feb. 4, 2014

(54) TRANSISTOR DEVICE WITH REDUCED GATE RESISTANCE

(75) Inventors: Shu-Jen Han, Courtlandt Manor, NY (US); Alberto Valdes Garcia, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/610,381

(22) Filed: Sep. 11, 2012

(65) Prior Publication Data

US 2013/0082243 A1    Apr. 4, 2013

Related U.S. Application Data

(63) Continuation of application No. 13/251,637, filed on Oct. 3, 2011.

(51) Int. Cl.
*H01L 29/775* (2006.01)

(52) U.S. Cl.
USPC ............. 257/29; 257/E29.245; 257/E21.409; 257/E29.255; 438/197; 438/151; 438/478

(58) Field of Classification Search
USPC ............. 257/24, 29, E29.168, E21.4; 438/69, 438/98, 142, 197, 149, 675
See application file for complete search history.

(56) References Cited

U.S. PATENT DOCUMENTS

| | | | |
|---|---|---|---|
| 5,120,668 A | 6/1992 | Hsu et al. | |
| 6,852,582 B2 | 2/2005 | Wei et al. | |
| 6,861,701 B2 | 3/2005 | Williams et al. | |
| 6,998,695 B2 | 2/2006 | Makiyama et al. | |
| 7,226,818 B2 * | 6/2007 | Malenfant et al. | ............ 438/149 |
| 7,858,989 B2 | 12/2010 | Chen et al. | |
| 2010/0248405 A1 * | 9/2010 | Tanaka | ............ 438/34 |

FOREIGN PATENT DOCUMENTS

| | | |
|---|---|---|
| EP | 0725445 A1 | 8/1996 |
| WO | WO2010110153 A1 | 9/2010 |

OTHER PUBLICATIONS

Boots, H., et al. "Scaling of Characteristic Frequencies in RF CMOS" IEEE Transactions on Electron Devices, vol. 51, No. 12. Dec. 2004. pp. 2102-2108.
Franklin, A., et al. "Current Scaling in Aligned Carbon Nanotube Array Transistors With Local Bottom Gating" IEEE Electron Device Letters, vol. 31, No. 7. Jul. 2010. pp. 644-646.
Han, S., et al. "Wafer Scale Fabrication of Carbon Nanotube FETS With Embedded Poly-Gates" IEDM Technical Digest. Dec. 2010. (4 Pages).
Koswatta, S., et al. "Ultimate RF Performance Potential of Carbon Electronics" IEEE Transactions on Microwave Theory and Techniques. May 2011. pp. 1-12.
Zhang, M., et al. "A Novel Local Bottom-Gate Carbon Nanotube Field Effect Transistor on SOI" IEEE International SOI Conference. Sep. 2003. Pages 63-64.

* cited by examiner

*Primary Examiner* — Ha Tran T Nguyen
*Assistant Examiner* — Thai T Vuong
(74) *Attorney, Agent, or Firm* — Tutunjian & Bitetto, P.C.; Vazken Alexanian

(57) ABSTRACT

A device with reduced gate resistance includes a gate structure having a first conductive portion and a second conductive portion formed in electrical contact with the first conductive portion and extending laterally beyond the first conductive portion. The gate structure is embedded in a dielectric material and has a gate dielectric on the first conductive portion. A channel layer is provided over the first conductive portion. Source and drain electrodes are formed on opposite end portions of a channel region of the channel layer. Methods for forming a device with reduced gate resistance are also provided.

14 Claims, 4 Drawing Sheets

US 8,642,997 B2

TRANSISTOR DEVICE WITH REDUCED GATE RESISTANCE

RELATED APPLICATION DATA

This application is a Continuation application of co-pending U.S. patent application Ser. No. 13/251,637 filed on Oct. 3, 2011, incorporated herein by reference in its entirety.

BACKGROUND

1. Technical Field

The present invention relates to semiconductor devices, and more particularly to devices with a gate structure with reduced gate resistance and methods for fabricating the same.

2. Description of the Related Art

Conventional top-gated field effect transistors (FET) include a number of associated parasitics. With continuous gate-length scaling associated with denser device layouts, FET gate resistance increases. As a result, maximum oscillating frequency ($f_{MAX}$) performance of complementary metal oxide semiconductor (CMOS) FETs has improved little beyond the 45 nm node. With conventional CMOS fabrication techniques, gate resistance can only be reduced by using multiple fingers, decreasing device width or employing a double-contacted gate structure. In such devices, additional metal layers (with lower resistance than poly-silicon) can make contact with a gate node only outside of the device area to reduce parasitic capacitances to make the device operable.

Top-gated devices may include a mushroom gate structure having an upper portion that extends over adjacent active regions. The mushroom-like gate structure attempts to reduce gate resistance by adding material to the gate electrode, but may in some instances contribute to capacitance parasitics with surrounding metal structures.

SUMMARY

A device with reduced gate resistance includes a gate structure having a first conductive portion and a second conductive portion formed in electrical contact with the first conductive portion and extending laterally beyond the first conductive portion. The gate structure is embedded in a dielectric material and has a gate dielectric on the first conductive portion. A channel layer is provided over the first conductive portion. Source and drain electrodes are formed on opposite end portions of a channel region of the channel layer.

Another device with reduced gate resistance includes a first dielectric layer having a first conductive portion embedded therein. A second dielectric layer is formed over the first dielectric layer and a portion of the first conductive portion. A second conductive portion is formed on the first conductive portion and is electrically connected to the first conductive portion and is formed within the second dielectric layer such that the first conductive portion extends laterally beyond the second conductive portion in at least one direction. A channel layer is provided over the second conductive portion, and source and drain electrodes are formed on opposite end portions of a channel region of the channel layer.

A method for forming a device with reduced gate resistance includes forming a conductive sheet in a first dielectric material; depositing a second dielectric material on the first dielectric material and the conductive sheet; forming one or more openings in the second dielectric material down to the conductive sheet; forming one or more conductive fingers in the one more openings in contact with the conductive sheet to form an embedded gate structure; depositing a gate dielectric layer on the one or more conductive fingers; forming a channel layer on the gate dielectric layer; and forming source and drain electrodes at end portions of a channel region of the channel layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
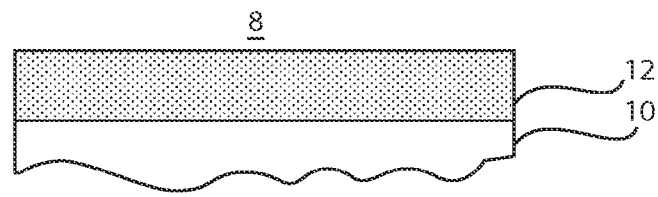
FIG. 1 is a cross-sectional view of a semiconductor device showing a substrate and a dielectric layer formed thereon in accordance with the present principles.

In accordance with the present principles, gate structures, devices and methods for fabrication are provided having reduced gate resistance without additional capacitive parasitics. Particularly useful embodiments include an embedded gate structure. The embedded gate structure includes a structure where a conductive channel layer is formed over the gate structure. The channel layers include graphene, carbon nanotubes, or any kind of semiconducting material, preferably a material that is transferable. In one embodiment, the gate structures are formed, followed by the conductive/semi-conductive channel layer, and then source and drain regions are formed on the channel layer. The gate structure includes additional material and may take the form of an inverted "T" shape, although other shapes like an "L" shape, etc. may be employed.

In one embodiment, the conductive channel layer includes an electrically conductive carbon material (which may be transferable over the gate structure) to be formed over the embedded gate structures. For the gate structures, in accordance with the present principles, capacitance between gate and the drain/source terminals is reduced with respect to conventional top-gate configurations. The use of different dielectrics and dielectric thicknesses for the embedded gate and the device itself permits further reduction in capacitance and optimizes a balance between resistance reduction and parasitic capacitance.

It is to be understood that the present invention will be described in terms of a given illustrative architecture employing a semiconductor wafer substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a device structure 8 includes a substrate 10 and a dielectric layer 12 formed on the substrate 10 in accordance with one illustrative embodiment. The substrate 10 may include a semiconductor substrate, e.g., silicon, GaAs, silicon on insulator or may include lower level metal layers in interlevel dielectric materials. The substrate 10 may include an electrically semiconducting material, an insulating material, a conductive material, devices or structures made of these materials or any combination thereof (e.g., a lower level of an interconnect structure). When the substrate 10 is comprised of a semiconducting material, any semiconductor such as Si, SiGe, SiGeC, SiC, Ge alloys, GaAs, InAs, InP and other III/V or II/VI compound semiconductors, or organic semiconductors may be employed. In addition to these listed types of semiconducting materials, substrate 10 may also be a layered semiconductor, such as, for example, Si/SiGe, Si/SiC, silicon-on-insulators (SOIs) or silicon germanium-on-insulators (SGOIs). These semiconductor materials may form a device, devices or structures, which may be discrete or interconnected.

When the substrate 10 includes a semiconducting material, one or more semiconductor devices such as, for example, complementary metal oxide semiconductor (CMOS) devices or other field effect transistors (FETs), strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon. When the substrate 10 is an electrical insulating material, the insulating material can be an organic insulator, an inorganic insulator or a combination thereof including multilayers. When the substrate 10 is an electrically conducting material, the substrate may include, for example, polysilicon, an elemental metal, an alloy including at least one elemental metal, a metal silicide, a metal nitride, etc. or combinations thereof including multilayers. These devices and device structures may be for computation, transmission, storage or display of information, such as logic devices, memory devices, switches or display devices.

The dielectric layer 12 may be formed on the surface of substrate 10 utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric layer 12 may include any suitable dielectric material such as, for example, SiC, SiN, $SiO_2$, a carbon doped oxide, a nitrogen and hydrogen doped silicon carbide SiC(N,H) or multilayers thereof. Dielectric layer 12 may be a continuous layer or a discontinuous layer. Dielectric layer 12 may have its material and thickness selected to provide reduced capacitance parasitics with nearby conductive structures.

Figure 2:
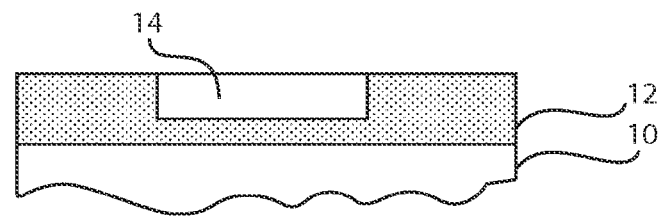
FIG. 2 is a cross-sectional view of the semiconductor device of FIG. 1 showing the dielectric layer having a trench formed therein in accordance with the present principles.

Referring to FIG. 2, the dielectric layer 12 is subjected to a lithography process to form an etch mask (not shown). The etch mask is employed to etch the dielectric layer 12 to form a trench 14 therein. The trench 14 is preferably formed by employing a reactive ion etch (RIE) or similar process.

Depending on the underlying layers (substrate 10), a sufficient amount of dielectric material should remain in dielectric layer 12 below the trench 14.

Figure 3:
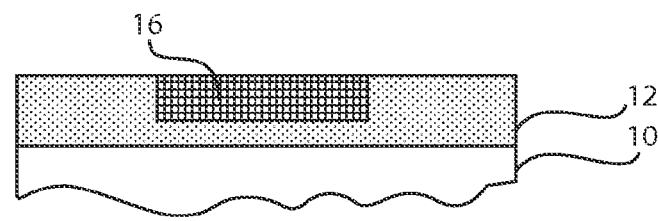
FIG. 3 is a cross-sectional view of the semiconductor device of FIG. 2 showing a conductive material or sheet formed in the trench of the dielectric layer in accordance with the present principles.

Referring to FIG. 3, a deposition of a conductive material 16 is performed. Conductive material 16 may include copper, aluminum, tungsten, titanium, doped polysilicon or any other useful conductive material or alloys/combinations thereof. The conductive material 16 may be deposited using chemical vapor deposition (CVD) or other deposition techniques. The deposition may be followed by a chemical-mechanical planarization (CMP) process to remove excess conductive material and to confine the conductive material 16 to the trench 14.

Figure 4:
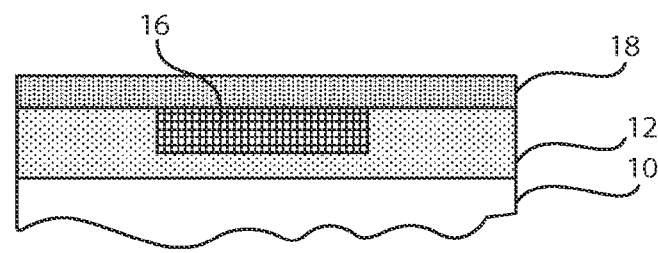
FIG. 4 is a cross-sectional view of the semiconductor device of FIG. 3 showing a second dielectric layer formed over the conductive sheet in accordance with the present principles.

Referring to FIG. 4, another dielectric layer 18 is deposited over the conductive material 16 in the trench 14 and over the dielectric layer 12 outside the trench 14. The dielectric layer 18 may be formed utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

The dielectric layer 18 may include any suitable dielectric material such as, for example, SiC, SiN, $SiO_2$, a carbon doped oxide, a nitrogen and hydrogen doped silicon carbide SiC(N, H) or multilayers thereof. The dielectric layer 18 need not be the same material as dielectric layer 12, but may be the same. The use of different dielectric materials and dielectric thicknesses for the dielectric layer 12 and the dielectric layer 18 permits further reduction in capacitance and optimizes a balance between resistance reduction in a gate structure and parasitic capacitance with conductive or semiconductive structures and the gate structure. Dielectric layer 18 may be a continuous layer or a discontinuous layer. The thicknesses for layers 12 and 18 may be, e.g., from several hundred nanometers to several micrometers.

Figure 5:
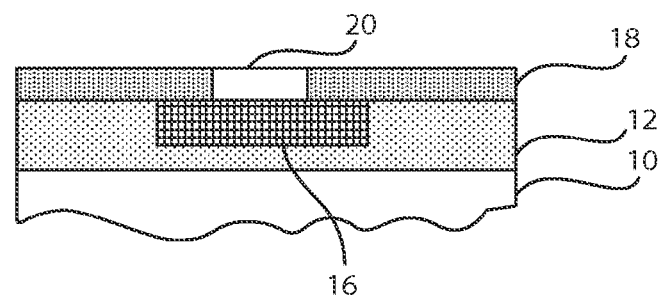
FIG. 5 is a cross-sectional view of the semiconductor device of FIG. 4 showing an opening formed in the second dielectric layer over the conductive sheet in accordance with the present principles.

Referring to FIG. 5, the dielectric layer 18 is subjected to another lithography process to form an etch mask (not shown). The etch mask is employed to etch the dielectric layer 18 to form a trench 20 therein. The trench 20 is preferably formed by employing a reactive ion etch (RIE) or similar process. The dielectric material should be removed down to the conductive material 16. It should be understood that the conductive material 16 may be large enough to form a plurality of trenches over a single section of conductive material 16. This enables the formation of a plurality of conductive fingers as illustratively depicted in FIG. 10.

Figure 6:
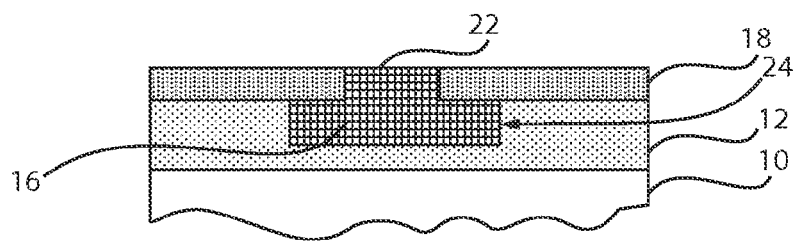
FIG. 6 is a cross-sectional view of the semiconductor device of FIG. 5 showing the opening formed in the second dielectric layer filled with conductive material to form an embedded gate structure in accordance with the present principles.

Referring to FIG. 6, a deposition of a conductive material 22 is performed. Conductive material 22 may include copper, aluminum, tungsten, titanium, doped polysilicon or any other useful conductive material or alloys/combinations thereof. The conductive material 22 may be deposited using chemical vapor deposition (CVD) or other deposition techniques. The deposition may be followed by a chemical-mechanical planarization (CMP) process to remove excess conductive material and to confine the conductive material 22 to the trench 20. Conductive material 22 need not be the same material as conductive material 16, but preferably is the same material to prevent the formation of an interface between conductive layers 16 and 22. Preferably, there should be little or no electrical resistance between conductive materials 16 and 20. The thicknesses of layers 16 and 20 can be from, e.g., about 50 nm to several hundred nanometers for 45 nm node technology. It should be understood that larger or smaller technologies are contemplated in accordance with the present principles.

Conductive materials 16 and 20 formed an inverted "T" shape that will be employed as an embedded gate structure 24. It should be understood that other shapes may be employed for structure 24. For example, structure 24 may include other configurations, such as an "L" shape, a rectangular shape, a U or inverted U-shape, etc. The conductive material 16 may have a gap between portions thereof that is connected or bridged by conductive material 22, etc.

It should be understood that the conductive material 16 preferably extends laterally beyond the boundaries of the conductive material 22 in at least one direction. In accordance with one aspect of the present principles, a single-sheet bottom-gate structure (e.g., conductive material 16 being a sheet) offers the minimum resistance possible for a given device size. A single-sheet gate structure (16) in a top-gated device would lead to significantly higher gate to drain and gate to source capacitances.

Figure 7:
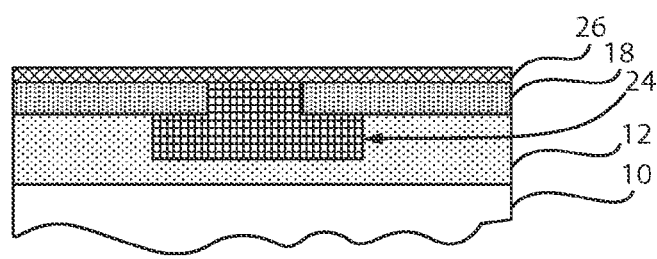
FIG. 7 is a cross-sectional view of the semiconductor device of FIG. 6 showing a gate dielectric layer formed over the conductive material that forms the embedded gate structure in accordance with the present principles.

Referring to FIG. 7, a gate dielectric layer 26 is deposited over the gate structure 24. The gate dielectric layer 26 may include a high-k dielectric material. High-k dielectric materials may include hafnium silicate, zirconium silicate, hafnium dioxide, zirconium dioxide, etc. The gate dielectric layer 26 may be deposited using atomic layer deposition or other suitable process. The gate dielectric layer 26 may have a thickness of about 1 nm to about 50 nm.

Figure 8:
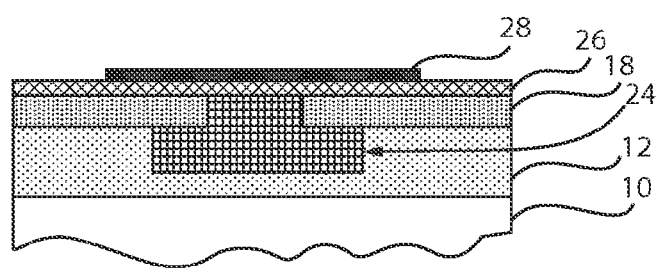
FIG. 8 is a cross-sectional view of the semiconductor device of FIG. 7 showing a channel layer formed over the gate dielectric layer in accordance with the present principles.

Referring to FIG. 8, a channel layer 28 is provided on the gate dielectric layer 26. While the channel layer 28 may include any suitable semiconductor material, in a particularly useful embodiment, a graphene material is employed. Graphene material may include a chemical vapor deposited (CVD) layer, an epitaxially grown layer, a solution based deposited layer (dipping), a mechanically exfoliated layer (transferred layer), etc. The process by which graphene is formed on the gate dielectric layer 26 may vary with the material of the layer 26, expense and/or other factors. For example, a mechanically exfoliated or CVD grown graphene can be deposited on an oxide based layer 26. The graphene material may be roughly formed in terms of coverage on the gate dielectric layer 26 and shaped later. For example, the graphene material may be transferred to the gate dielectric layer 26 and lithographically patterned to form the channel layer 28. The graphene material 28 may be formed with between about 1 to about 10 graphene layers. Although additional layers may be useful, a single layer of graphene is preferred.

Channel layer 28 may include other materials as well. For example, carbon nanotubes may be employed. Carbon nanotubes and graphene are strong candidates for channel materials, especially for high speed electronic devices. Gate resistance may become one of the main radio frequency (RF) performance limiting factors in such devices. A change of only, e.g., 2 Ohms in gate resistance can degrade maximum oscillating frequency, $f_{MAX}$, by ~30% or more depending on capacitive parasitics. A conventional top-gated graphene FET that employs an enlarged gate to reduce gate resistance would ultimately be limited by capacitive parasitics due to the proximity of the gate structure to upper level metal structure and adjacent source and drain regions (especially for self-aligned devices).

Figure 9:
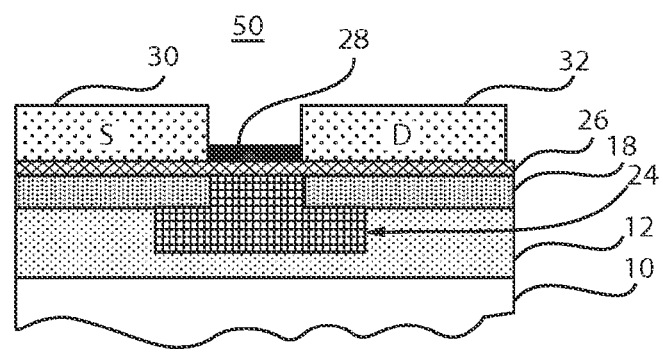
FIG. 9 is a cross-sectional view of the semiconductor device of FIG. 8 showing source and drain electrodes formed at end portions of the channel layer in accordance with the present principles.

Referring to FIG. 9, top electrodes 30 and 32 are formed, respectively for a source (S) and a drain (D) of device 50. Electrodes 30 and 32 are preferably formed of a highly conductive material. Electrodes 30 and 32 may include, e.g., copper, aluminum, tungsten, titanium, doped polysilicon or any other useful conductive material or alloys/combinations thereof. Electrodes 30 and 32 may also include highly doped semiconductor materials. Electrodes 30 and 32 may be deposited using a CVD or other deposition process followed by a lithography and etch process or a lift-off process to remove the electrode materials from the channel layer 28. The electrodes 30 and 32 may be formed completely on the channel layer 28 or a portion of channel layer 28.

In accordance with the present principles, gate resistance is reduced by the large gate structure 24 (e.g., inverted T-shape). Capacitive parasitics are reduced between the gate structure 24 and the source (S) and drain (D), and between the gate structure 24 and any conductive contacts, interlevel metallization, or another other conductive materials. The gate structure 24 is buried in or below dielectric layers 12 and 18 and is located a fair distance from other conductive structures. This reduces the capacitive parasitics considerably especially in small (nm-sized) designs.

Figure 10:
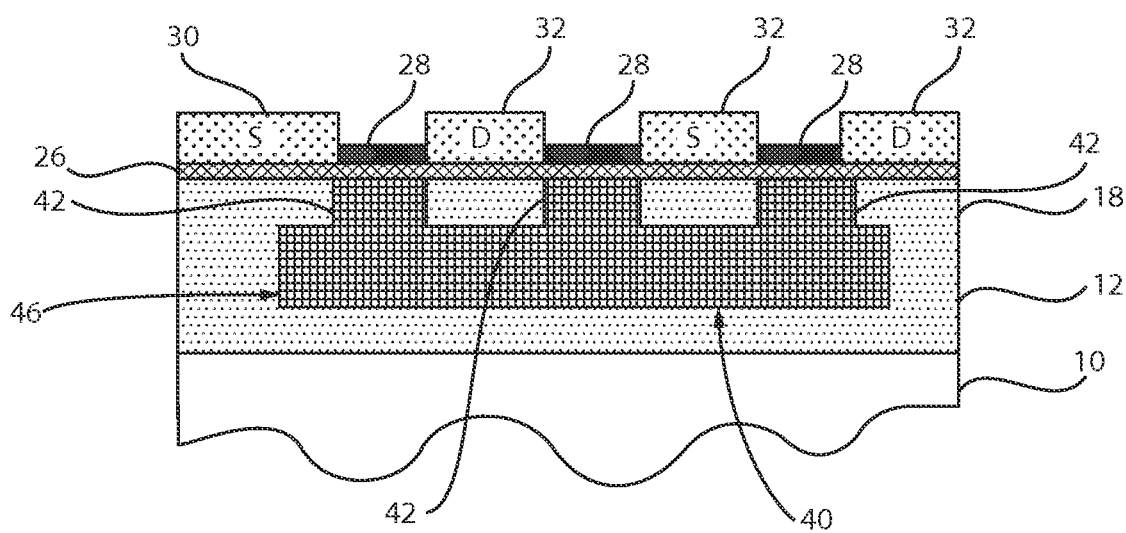
FIG. 10 is a cross-sectional view of a semiconductor device showing source and drain electrodes formed between channel layer segments in accordance with the present principles.

Referring to FIG. 10, a device 55 is illustratively shown in accordance with another embodiment. As described with reference to FIGS. 5 and 6, trench 20 may have included a plurality of trenches or other patterns. When conductive material 22 is deposited, material 22 is deposited in all trenches 20 to form multiple fingers 42. A gate sheet 40 is formed to be wide enough to provide contact with corresponding fingers 42. Gate sheet 40 and fingers 42 form a gate structure 46 for device 55. The dielectric layer 26 is formed over fingers 42. Each finger 42 corresponds to a portion of the channel layer 28. In this embodiment, electrodes 30 and 32 include two source (S) electrodes and two drain (D) electrodes. Other configurations are also possible and contemplated in accordance with the present principles.

Devices 50 and 55 are then further processed to form contacts and upper metal layers using known methods. The channel layer 28 will have a dielectric material (not shown) formed thereon. This material may be the same material employed for interlevel dielectric layers.

Figure 11:
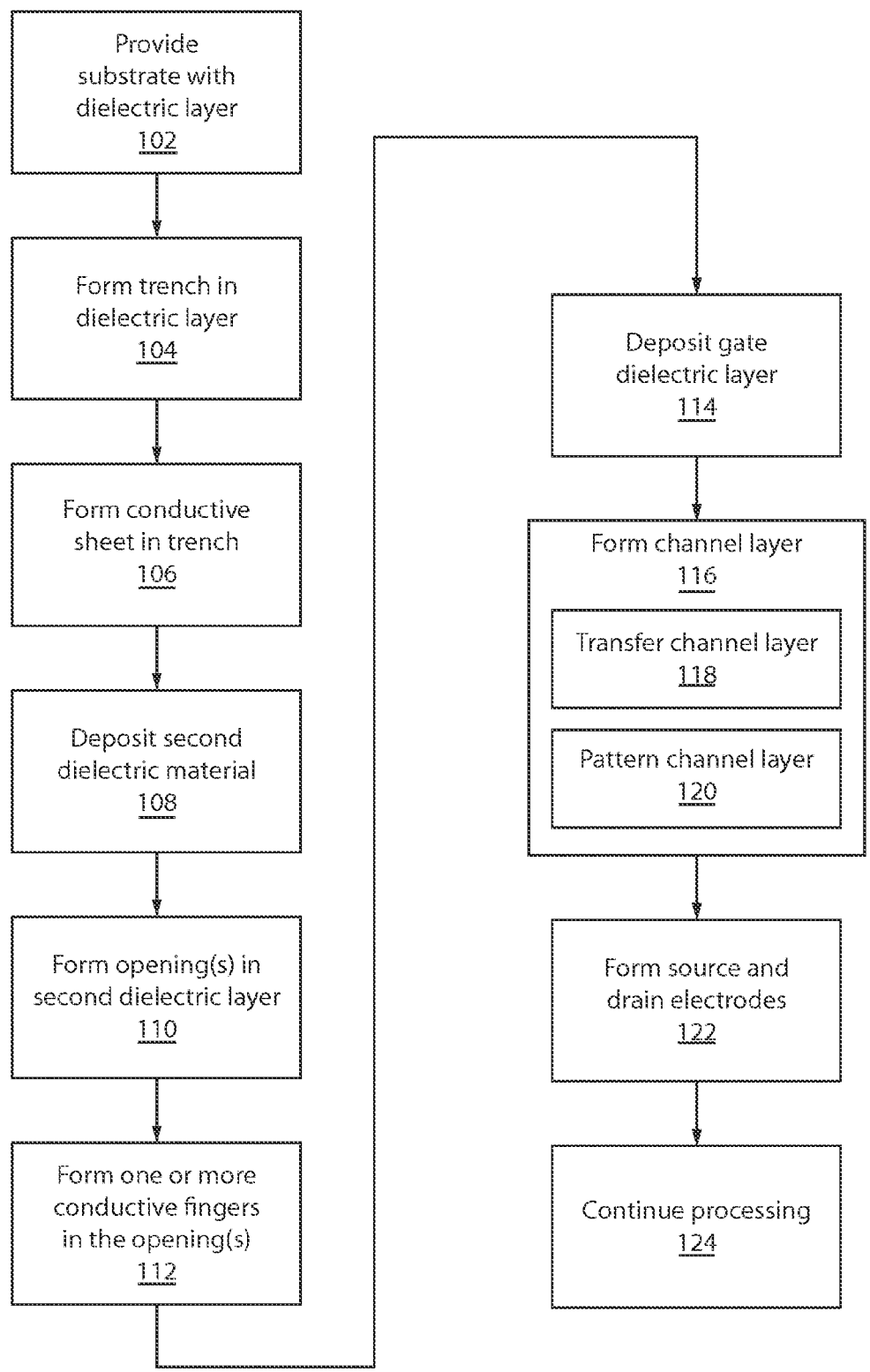
FIG. 11 is a block/flow diagram showing a method for fabricating a device having an embedded gate structure with reduced gate resistance and reduced parasitic capacitance in accordance with one illustrative embodiment.

Referring to FIG. 11, a block/flow diagram shows an illustrative method for forming a transistor device with an embedded gate structure. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 102, a substrate having one or more layers and including a first dielectric material is provided or formed. In block 104, a trench is formed in the dielectric layer. In block 106, a conductive sheet is formed in the trench in the first dielectric material. In an alternate embodiment, a trench need not be formed. Instead, a conductive material/sheet can be patterned on the first dielectric material. In block 108, a second dielectric material is deposited on the first dielectric material and the conductive sheet. The second dielectric material covers the conductive material/sheet. In block 110, one or more openings are formed in the second dielectric material down to the conductive sheet. In block 112, one or more conductive fingers are formed in the one more openings in contact with the conductive sheet to form an embedded gate structure. The conductive sheet extends beyond at least one or the conductive fingers in a lateral direction. In block 114, a gate dielectric layer is deposited on the one or more conductive fingers. The gate dielectric layer may include a high-k material, e.g., a material having a dielectric constant greater than that of $SiO_2$.

In block 116, a channel layer is formed on the gate dielectric layer. The channel layer may include a conductive form of carbon or other semiconductor material. In block 118, the channel layer may include one or more layers of graphene, and the channel layer is preferably provided by a transfer process. Other processes may also be employed. In block 120, the channel layer may be patterned to conform its shape to the underlying gate structure.

In block 122, source and drain electrodes are formed at end portions of the channel layer. When a plurality of conductive fingers are present, source and drain electrodes may be formed between the plurality of conductive fingers. In block 124, processing is completed by forming back end of line (BEOL) structures, such as interlevel dielectric layers, contacts, metal lines, etc.

Having described preferred embodiments for transistor devices and methods for reduced gate resistance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device with reduced gate resistance, comprising:
    a gate structure having:
        a first conductive portion; and
        the second conductive portion formed in electrical contact with the first conductive portion and extending laterally beyond the first conductive portion;
        the gate structure being embedded in a dielectric material and having a gate dielectric on the first conductive portion;
    a channel layer provided over the first conductive portion; and
    source and drain electrodes formed on opposite end portions of a channel region of the channel layer.

2. The device as recited in claim 1, wherein the channel layer includes a conductive form of carbon.

3. The device as recited in claim 1, wherein the channel layer includes one or more layers of graphene.

4. The device as recited in claim 1, wherein the gate structure includes an inverted T-shape in a cross-section.

5. The device as recited in claim 1, wherein second conductive portion includes a sheet and the first conductive portion includes a single conductive finger.

6. The device as recited in claim 1, wherein second conductive portion includes a sheet and the first conductive portion includes a plurality of conductive fingers.

7. The device as recited in claim 6, wherein the source and drain electrodes are disposed between the plurality of conductive fingers.

8. A device with reduced gate resistance, comprising:
    a first dielectric layer having a first conductive portion embedded therein;
    a second dielectric layer formed over the first dielectric layer and a portion of the first conductive portion;
    a second conductive portion formed on the first conductive portion and electrically connected to the first conductive portion and within the second dielectric layer such that the first conductive portion extends laterally beyond the second conductive portion in at least one direction;
    a channel layer provided over the second conductive portion; and
    source and drain electrodes formed on opposite end portions of a channel region of the channel layer.

9. The device as recited in claim 8, wherein the channel layer includes a conductive form of carbon.

10. The device as recited in claim 8, wherein the channel layer includes one or more layers of graphene.

11. The device as recited in claim 8, wherein the first and second conductive portion form an inverted T-shape in a cross-section.

12. The device as recited in claim 8, wherein first conductive portion includes a sheet and the second conductive portion includes a single conductive finger.

13. The device as recited in claim 8, wherein first conductive portion includes a sheet and the second conductive portion includes a plurality of conductive fingers.

14. The device as recited in claim 13, wherein the source and drain electrodes are disposed between the plurality of conductive fingers.

\* \* \* \* \*